(12) United States Patent
Caggiano et al.

(10) Patent No.: US 7,652,871 B2
(45) Date of Patent: Jan. 26, 2010

(54) METHODS AND SYSTEMS FOR ELECTRICAL POWER SUB-METERING

(75) Inventors: Robert J. Caggiano, Wolcott, CT (US); Suresh Redditha, Hyderabad (IN); Raghunath Parbhu, Bangalore (IN)

(73) Assignee: General Electric Company, Schenectady, NY (US)

(*) Notice: Subject to any disclaimer, the term of this patent is extended or adjusted under 35 U.S.C. 154(b) by 299 days.

(21) Appl. No.: 11/325,592

(22) Filed: Jan. 4, 2006

(65) Prior Publication Data

US 2007/0153438 A1 Jul. 5, 2007

(51) Int. Cl.
*H02B 1/20* (2006.01)

(52) U.S. Cl. .............. 361/652; 361/93.1; 361/648; 361/676; 324/117 R; 335/16; 439/508

(58) Field of Classification Search .......... 361/624, 361/627, 644, 93.1, 93.6, 111, 628, 641, 361/648, 652, 676; 336/176, 229; 439/508; 335/186, 202, 16, 26, 39; 324/522, 117 R, 324/126; 200/50.07
See application file for complete search history.

(56) References Cited

U.S. PATENT DOCUMENTS

| | | | | |
|---|---|---|---|---|
| 3,955,123 A * | 5/1976 | Goodridge | .................. | 361/660 |
| 4,048,605 A * | 9/1977 | McCollum | .................. | 336/176 |
| 4,327,396 A * | 4/1982 | Schacht | .................. | 361/676 |
| 4,386,280 A * | 5/1983 | Ricaud et al. | .................. | 307/145 |
| 4,463,227 A * | 7/1984 | Dizon et al. | .................. | 200/50.07 |
| 6,111,489 A * | 8/2000 | Tiemann | .................. | 335/202 |
| 6,313,980 B1 * | 11/2001 | Craft et al. | .................. | 361/627 |
| 6,442,011 B1 * | 8/2002 | Attarian et al. | .................. | 361/93.1 |
| 6,611,137 B2 * | 8/2003 | Haensgen et al. | .................. | 324/117 H |
| 6,754,059 B2 * | 6/2004 | Bach et al. | .................. | 361/93.1 |
| 6,765,787 B2 * | 7/2004 | Beasley et al. | .................. | 361/641 |
| 6,865,073 B2 * | 3/2005 | Werner et al. | .................. | 361/624 |
| 7,148,675 B2 * | 12/2006 | Itoh | .................. | 324/117 R |
| 7,252,543 B2 * | 8/2007 | Caggiano et al. | .................. | 439/508 |
| 7,312,686 B2 * | 12/2007 | Bruno | .................. | 336/229 |
| 7,423,858 B2 * | 9/2008 | Dobbs et al. | .................. | 361/93.1 |
| 2005/0141159 A1 * | 6/2005 | Gamba et al. | .................. | 361/93.1 |
| 2006/0255793 A1 * | 11/2006 | Montreuil | .................. | 324/117 R |
| 2008/0041704 A1 * | 2/2008 | McCoy | .................. | 200/50.32 |
| 2008/0042787 A1 * | 2/2008 | McCoy | .................. | 335/186 |

* cited by examiner

*Primary Examiner*—Jayprakash N Gandhi
*Assistant Examiner*—Courtney Smith
(74) *Attorney, Agent, or Firm*—Armstrong Teasdale LLP

(57) ABSTRACT

An electrical distribution panel includes a backplane, a circuit breaker comprising a load conductor for transmitting electrical power to a load, and a load sensing assembly comprising a load sensor operatively coupled to the load conductor for detecting an electrical load of the load conductor and generating a load signal proportional to the electrical load. The load sensing assembly is selectively positionable with respect to the load conductor at a plurality of fixedly secured positions on the backplane to facilitate positioning the load sensor with respect to the load conductor.

30 Claims, 6 Drawing Sheets

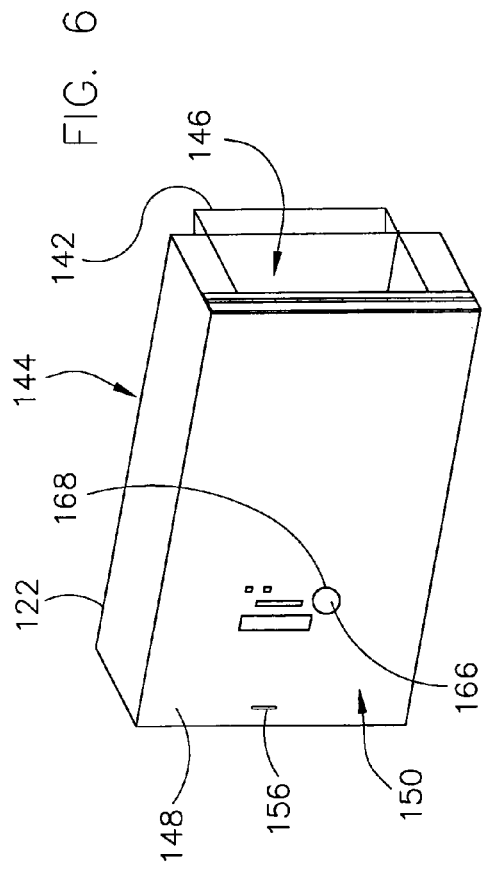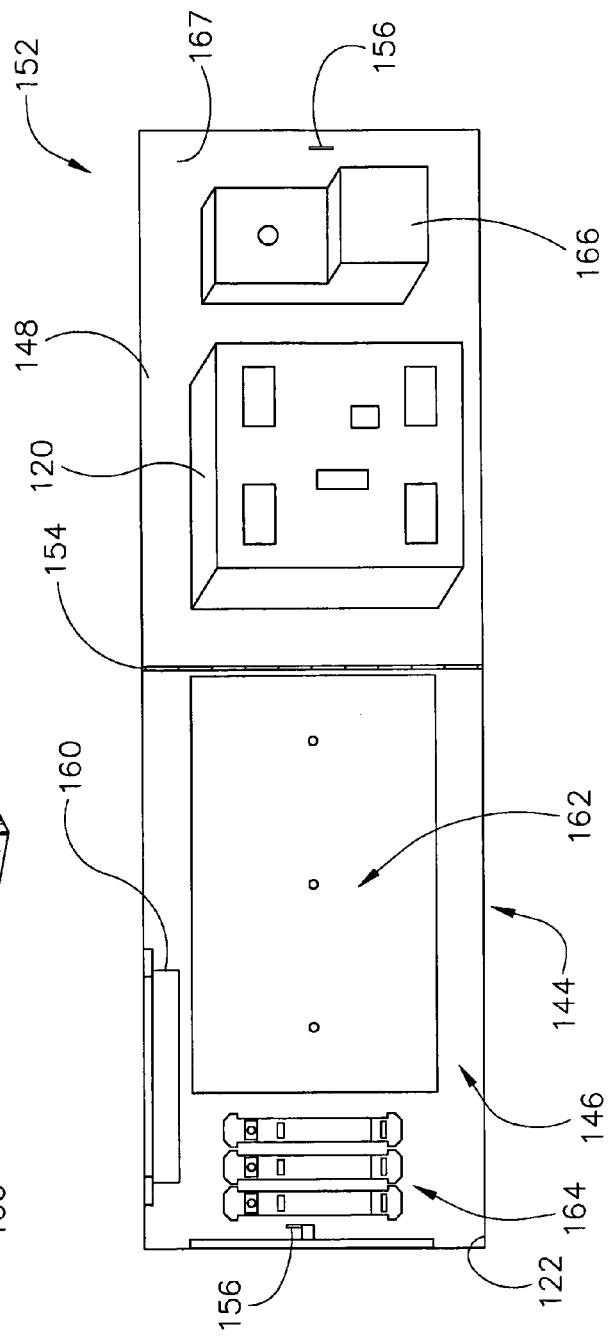

US 7,652,871 B2

METHODS AND SYSTEMS FOR ELECTRICAL POWER SUB-METERING

BACKGROUND OF THE INVENTION

This invention relates generally to electrical distribution panels, and more specifically to methods and systems for sub-metering electrical power supplied from electrical distribution panels.

At least some government entities, such as states, are permitting, and in some cases requiring, deregulation of wholesale electricity distribution. In such areas, electricity distribution to an individual customer was limited to a regulated utility entity. With new regulations in effect, a landlord, for example an apartment building owner, may now purchase bulk power for the apartment building and resell the power to the individual apartment residents. Heretofore, the metering of power distributed to individual apartments was performed by individual demand meters corresponding to each apartment and owned by the regulated utility. A new metering scheme, to take advantage of the deregulated environment, may allow for only one utility electrical demand meter per apartment building, however, load to each individual apartment may still need to be determined for billing purposes

BRIEF DESCRIPTION OF THE INVENTION

In one aspect, an electrical distribution panel includes a backplane, a circuit breaker comprising a load conductor for transmitting electrical power to a load, and a load sensing assembly comprising a load sensor operatively coupled to the load conductor for detecting an electrical load of the load conductor and generating a load signal proportional to the electrical load. The load sensing assembly is selectively positionable with respect to the load conductor at a plurality of fixedly secured positions on the backplane to facilitate positioning the load sensor with respect to the load conductor.

In another aspect, a load sensing assembly includes a bracket having a slot. The bracket is configured to be coupled to an electrical distribution panel adjacent a circuit breaker having a load carrying circuit conductor. The assembly also includes a load sensor configured to be operatively coupled to the load carrying circuit conductor for generating a load signal proportional to the load carried in the load carrying circuit conductor. The load sensor is selectively positionable on the bracket at a plurality of fixedly secured positions along the slot to facilitate positioning the load sensor with respect to the load carrying circuit conductor.

In another aspect, a method is provided for coupling a load sensor to an electrical distribution panel. The method includes coupling the load sensor to a bracket, coupling the bracket to the electrical distribution panel, moving the load sensor with respect to the bracket and a load carrying circuit conductor after coupling the load sensor to the bracket to position the load sensor with respect to the load carrying circuit conductor, fixedly securing the load sensor with respect to the bracket, and operatively coupling the load sensor to the load carrying circuit conductor.

BRIEF DESCRIPTION OF THE DRAWINGS

FIG. 6 is a perspective view of an exemplary embodiment of a sub-metering electronics system housing.

FIG. 7 is a perspective view of the sub-metering electronics system housing shown in FIG. 6 illustrating an interior cavity of the housing.

DETAILED DESCRIPTION OF THE INVENTION

Figure 1:
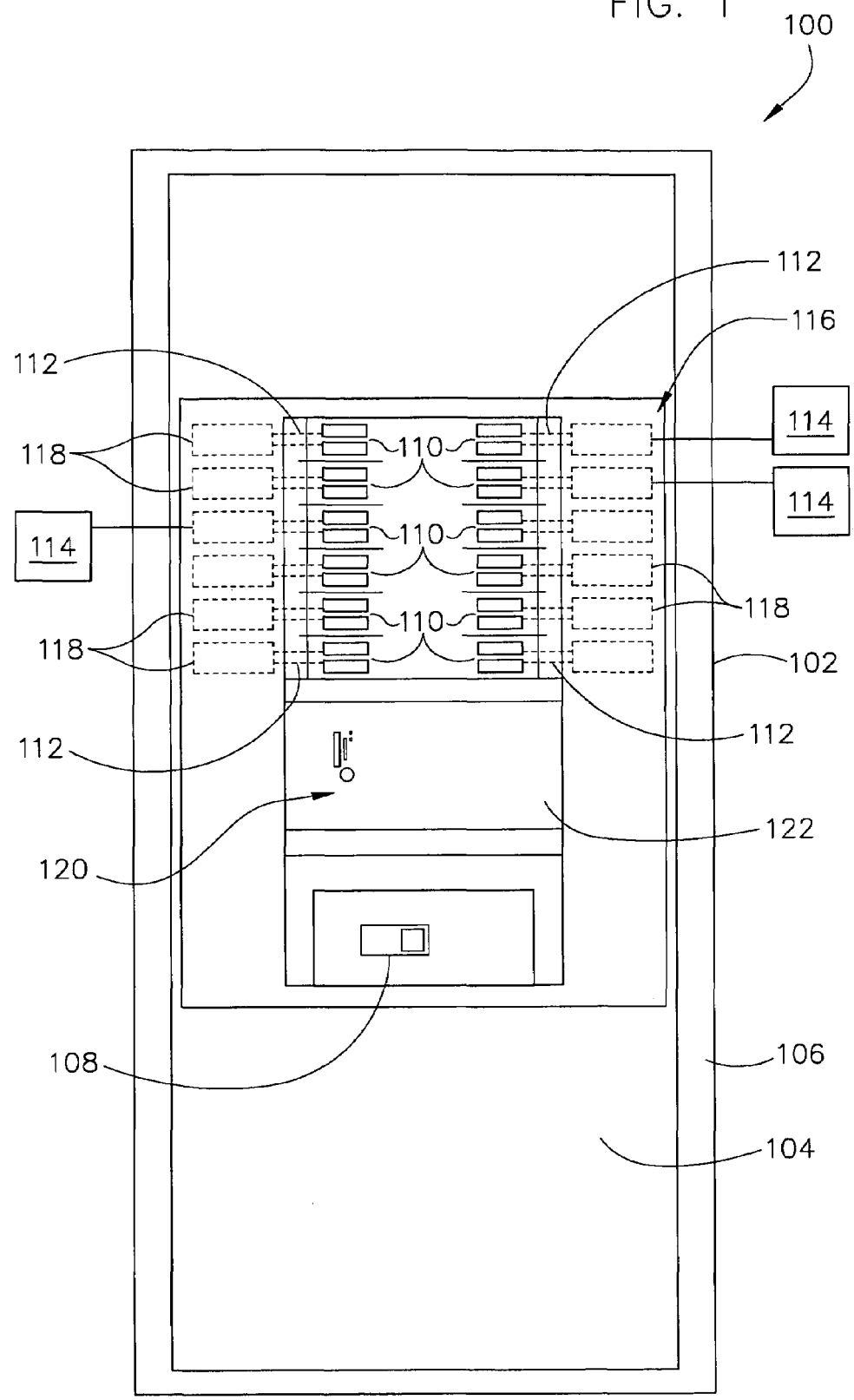
FIG. 1 is a schematic diagram of an exemplary embodiment of an electrical distribution panel.
Figure 2:
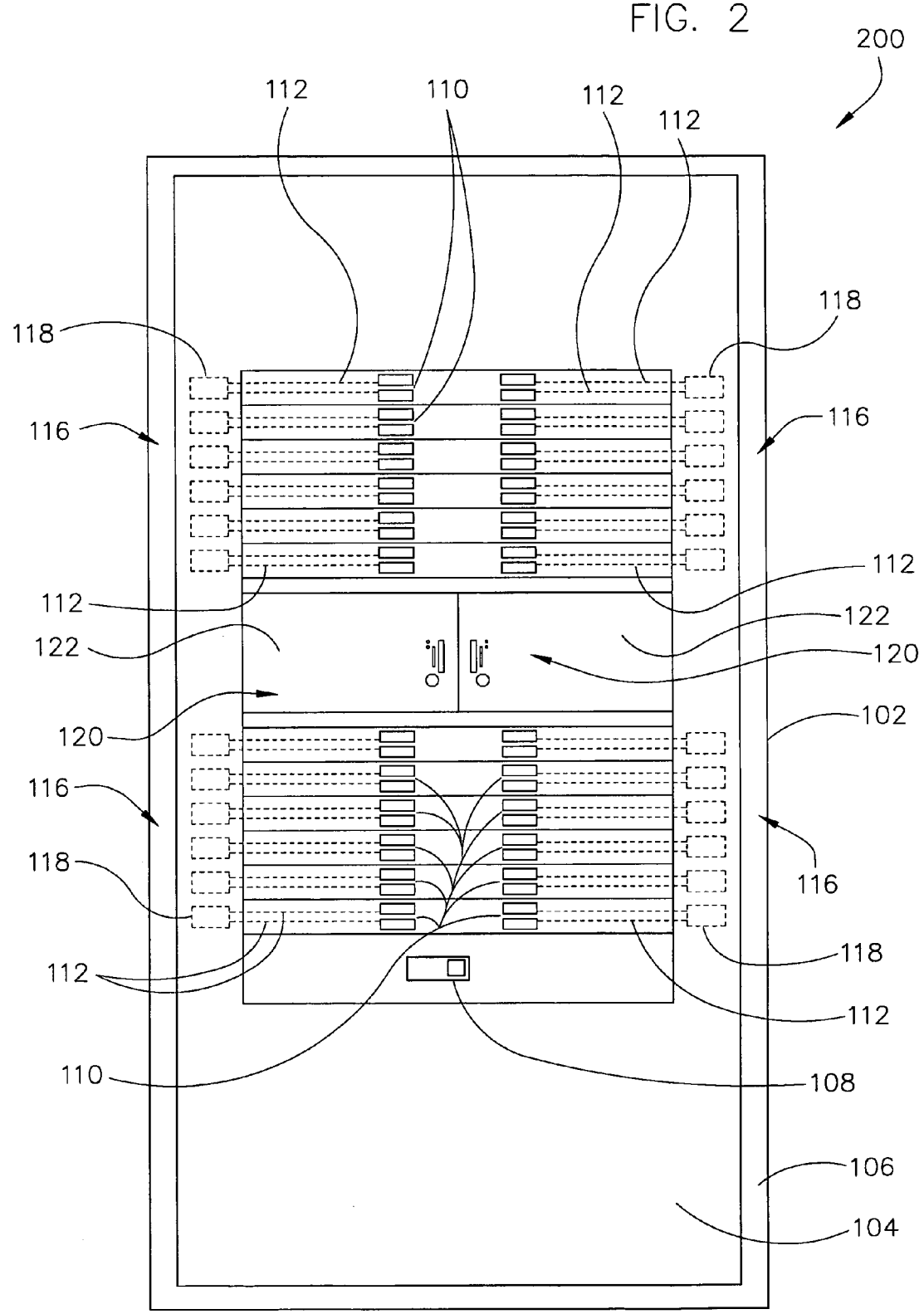
FIG. 2 is a schematic diagram of an exemplary alternative embodiment of the electrical distribution panel shown in FIG. 1.

FIG. 1 is a schematic diagram of an exemplary embodiment of an electrical distribution panel 100. In the exemplary embodiment, distribution panel 100 includes a base 102 that may include one or more sidewalls (not shown) extending therefrom to define an at least partially enclosed space. A backplane 104 may be coupled to an interior surface 106 of base 102. Backplane 104 may be mounted directly on surface 106 or may be separated from surface 106 by standoffs or spacers (not shown) positioned between surface 106 and backplane 104 such that a gap (not shown) is defined between surface 106 and backplane 104. A main circuit breaker 108 may be coupled to panel 100, for example to backplane 104, such that contacts (not shown) within circuit breaker 108 engage a plurality of alternating current (AC) power lines L1, L2, neutral line N. Although panel 100 may be supplied with any suitable type of voltage, in some embodiments lines L1, L2, N supply 120/240 VAC, single phase, three wire voltage to distribution panel 100 from a mains. Other examples of types of voltage supplied to panel 100 include, but are not limited to, 120/208 VAC, 480/277 VAC, 600/347 VAC, and/or 120/240 VAC. A plurality of branch circuit breakers 110 may also be coupled to panel 100, for example to backplane 104, such that when main circuit breaker 108 is engaged with lines L1, L2, N, contacts within branch circuit breakers 110 (not shown) engage lines L1, L2, neutral line N for receiving voltage therefrom. Although twelve branch circuit breakers 110 are illustrated in FIG. 1, panel 100 may include any number of branch circuit breakers 110. For example, FIG. 2 illustrates an electrical distribution panel 200 that includes twenty four branch circuit breakers 110 mounted thereon.

One or more load conductors 112 of each branch circuit breaker 110 transmit load current between each circuit breaker 110 and a corresponding load 114, such as, but not limited to, any commonly owned and subleased facility, such as, but not limited to, apartment dwelling and/or multi-family units, commercial facilities, office buildings, campuses of buildings, industrial facilities, and/or factories. The circuits defined by each corresponding circuit breaker 110 and load 114 may be referred to herein as "branch circuits". In some embodiments, one or more load conductors 112 includes a phase cable of the corresponding branch circuit breaker 110. However, load conductors 112 may be any device capable of performing the functions described herein. Moreover, although two load conductors 112 are illustrated in FIGS. 1 and 2 for each branch circuit breaker 110, each breaker 110 may include any number of load conductors 112.

Figure 3:
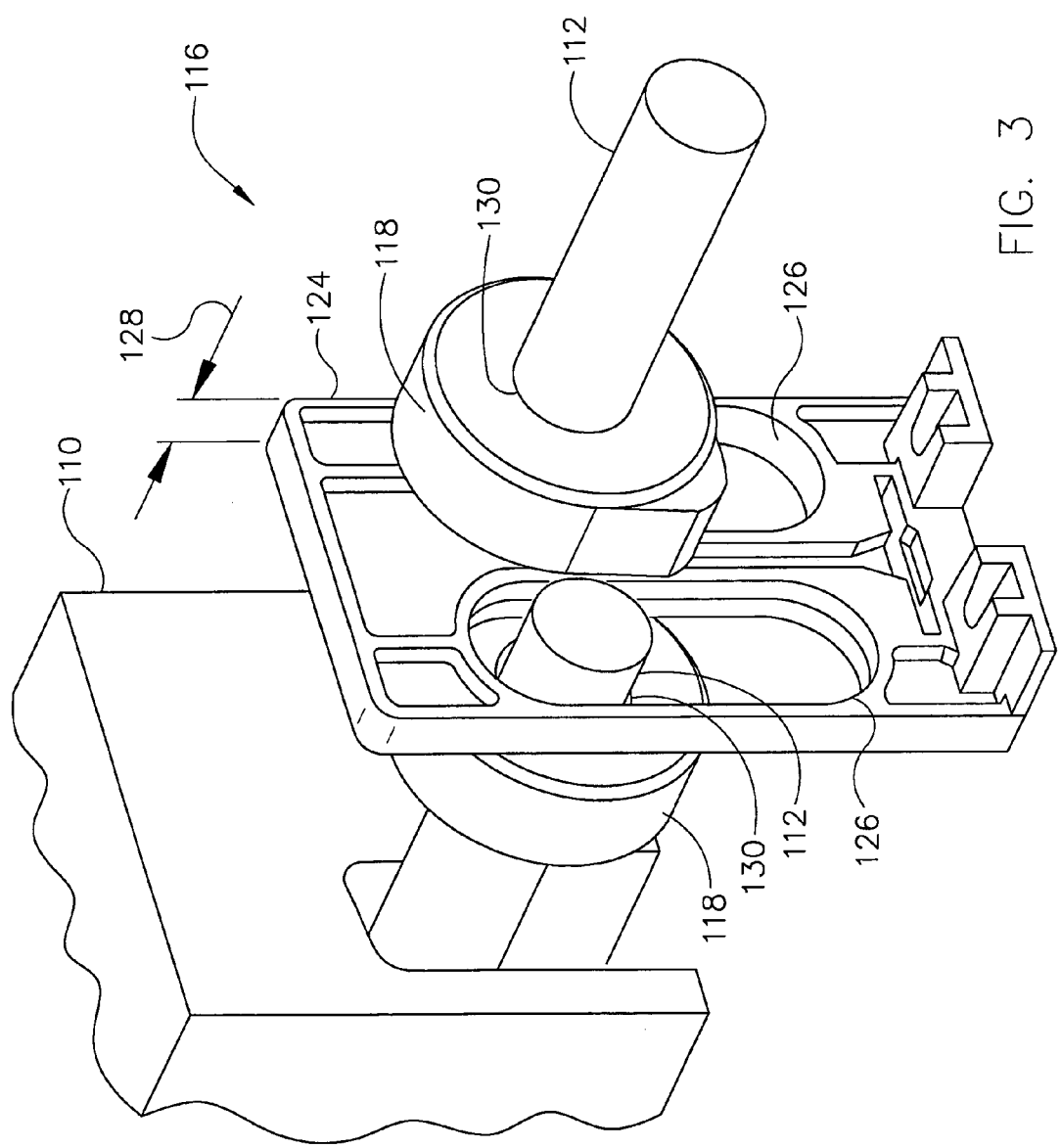
FIG. 3 is a perspective view of an exemplary embodiment of a load sensing assembly for use with the electrical distribution panels shown in FIGS. 1 and 2.
Figure 4:
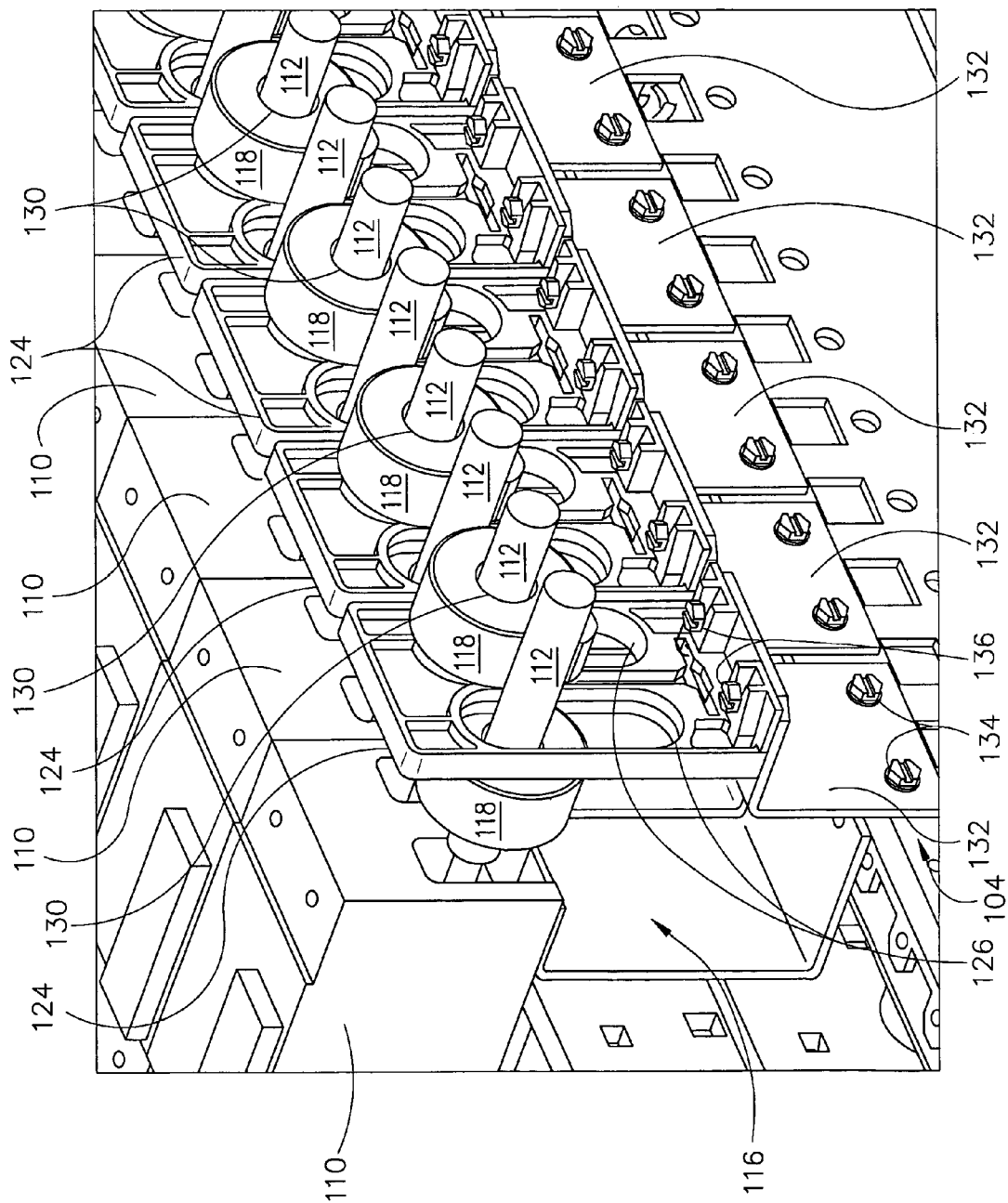
FIG. 4 is perspective view of an exemplary embodiment of the load sensing assembly shown in FIG. 3 coupled to either of the electrical distribution panels shown in FIGS. 1 and 2.
Figure 5:
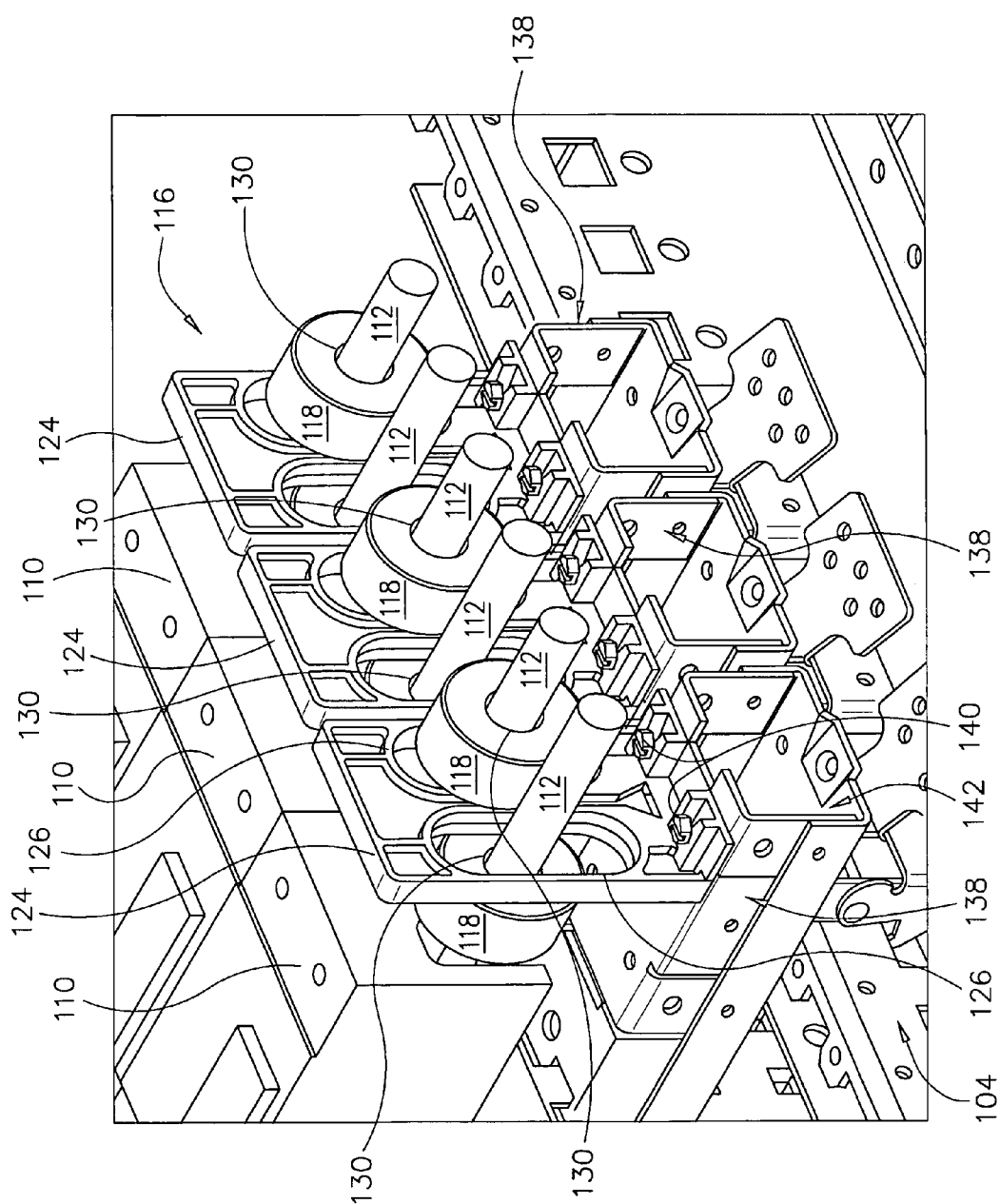
FIG. 5 is perspective view of another exemplary embodiment of the load sensing assembly shown in FIG. 3 coupled to either of the electrical distribution panels shown in FIGS. 1 and 2.

A load sensing assembly 116 is coupled to panel 100 (or panel 200 in the embodiment of FIG. 2) and includes a plurality of load sensors 118. More specifically, in the exemplary embodiment each load conductor 112 is operatively coupled to a corresponding load sensor 118 for detecting an electrical load of the corresponding load conductor 112. Each load sensor 118 generates a load signal proportional to the detected electrical load in the corresponding load conductor 112. In the exemplary embodiment, and more specifically as illustrated in FIGS. 3-5, load sensors 118 are current transformers having a primary circuit of a first predetermined number of turns and a secondary circuit having a second predetermined number of turns. However, load sensors 118 may be any sensing device capable of performing the functions described herein, and load sensors 118 may each be operatively coupled to a corresponding load conductor 112 in any suitable orientation, location, fashion, configuration, arrangement, and/or by any suitable structure and/or means. Moreover, load sensors 118 may each have any suitable size and/or shape. For example, in the exemplary embodiment load sensors 118 each include a generally circular cross-sectional shape, including an opening 130 that includes a generally circular cross-sectional shape, and each load conductor 112 extends through an opening 130 of a corresponding load sensor 118.

One or more sub-metering electronics systems 120 may be coupled to distribution panel 100 (or panel 200 in the embodiment of FIG. 2), for example to backplane 104, and operatively coupled to one or more of load sensors 118 for determining the electrical load in one or more of the branch circuits, based on the corresponding detected load. As such, load sensing assembly 116 and sub-metering electronics system(s) 120 facilitate metering voltage supplied to one or more of the branch circuits. As illustrated in FIGS. 1 and 2 and will be described below in more detail, sub-metering electronics systems 120 may be contained within a housing 122 that may be coupled to panel 100 (or panel 200 in the embodiment of FIG. 2), for example to backplane 104. Housing 122 may facilitate protecting sub-metering electronics systems 120 and/or may define a wire gutter for input wires carrying signals from load sensors 118. Although one sub-metering electronics system 120 is illustrated in FIG. 1, and two sub-metering electronics systems 120 are illustrated in FIG. 2, panels 100 and 200 may include any number of sub-metering electronics systems 120 for metering voltage supplied to any number of branch circuits, whether contained within the same or different housings 122.

FIG. 3 is a perspective view of an exemplary embodiment of load sensing assembly 116. Assembly 116 includes a bracket 124 and one or more load sensors 118 coupled to bracket 124. Each load sensor 118 is selectively positionable at a plurality of positions on bracket 124 to facilitate positioning each load sensor 118 with respect to its corresponding conductor 112. As used herein, the terms "position", "positions", "positionable", and/or "positioned" include locations and/or orientations. Once positioned with respect to bracket 124, each load sensor 118 can be fixedly secured in such position, for example as will be described below. As such, load assembly 116 may facilitate decreasing a difficulty of installing and/or maintaining panels 100 (shown in FIG. 1) and 200 (shown in FIG. 2).

Each load sensor 118 may be selectively positionable at any suitable position on bracket 124 than enable load sensors 118 to function as described herein. For example, in the exemplary embodiment, bracket 124 includes a plurality of slots 126 that extend completely through a thickness 128 of bracket 124 such that slots 126 define slot openings within bracket 124. In the exemplary embodiment, a portion of each load conductor 112 extends through a corresponding bracket slot 126 and extends through an opening 130 within its corresponding load sensor 118. Alternatively, in some embodiments slots 126 do not extend completely through bracket thickness 128 and load conductors 112 do not extend through a corresponding slot 126 (whether each load conductor 112 extends through a corresponding sensor opening 130). In the exemplary embodiment, each load sensor 118 is positionable on bracket 124 at a plurality of positions along a corresponding slot 126. Accordingly, load sensors 118 may each be positioned along their corresponding slots 126 to position load sensors 118 with respect to their corresponding load conductor 112. For example, in the exemplary embodiment each load sensor 118 is positioned along its corresponding slot 126 to facilitate aligning its opening 130 with its corresponding load conductor 112. As such, load sensing assembly 116 may facilitate decreasing a difficulty of installing and/or maintaining panels 100 and 200. For example, load sensing assembly 116 may facilitate decreasing a difficulty of installing and/or maintaining load sensors 118. Once positioned, load sensors 118 may each be fixedly secured in position with respect to their corresponding bracket 124 using any suitable structure and/or means, such as, but not limited to, wire ties, clamps, and/or threaded fasteners.

In some embodiments, each load sensor 118 is coupled to bracket 124 for movement with respect to bracket 124 and its corresponding load conductor 112 once load sensors 118 are coupled to bracket 124, for example to further facilitate positioning each load sensor 118 with respect to its corresponding conductor 112. Each load sensor 118 may be coupled to bracket 124 for movement with respect to bracket 124 once coupled thereto in any suitable orientation, location, fashion, configuration, arrangement, and/or by any suitable structure and/or means. For example, each load sensor 118 may be movable coupled to bracket 124 using fasteners such as, but not limited to, wire ties or other fasteners that allow and/or facilitate relative movement between sensors 118 and their corresponding brackets 124 when sensors 118 are coupled thereto. In the exemplary embodiment, each load sensor 118 is coupled to bracket 124 for movement with respect to bracket 124 along a corresponding slot 126. Accordingly, after load sensors 118 have been coupled to bracket 124, each sensor 118 may be moved along their corresponding slots 126 to position load sensors 118 with respect to their corresponding load conductor 112. For example, in the exemplary embodiment each load sensor 118 is moved along its corresponding slot 126 to facilitate aligning its opening 130 with its corresponding load conductor 112. Once positioned, load sensors 118 may each be fixedly secured in position with respect to their corresponding bracket 124 using any suitable structure and/or means, such as, but not limited to, the same fastener that allows and/or facilitate relative movement between sensors 118 and their corresponding brackets 124 when sensors 118 are coupled thereto and/or another fastener such as, but not limited to, wire ties, clamps, and/or threaded fasteners. As such, load sensing assembly 116 may facilitate decreasing a difficulty of installing and/or maintaining panels 100 and 200. For example, load sensing assembly 116 may facilitate decreasing a difficulty of installing and/or maintaining load sensors 118. Each load sensor 118 may be positioned with respect to bracket 124 (whether once coupled to bracket 124 and/or prior to being coupled to bracket 124) before, during, and/or after bracket 124 is coupled to panels 100 or 200.

Although bracket 124 is illustrated as having two slots 126 for receiving two load conductors 112 from a single branch circuit breaker 110, bracket 124 may have any number of slots 126 for receiving any number of load conductors 112 from a single breaker 110, and/or any number of slots for receiving any number of load conductors 112 from a plurality of breakers 110. Moreover, although bracket 124 is illustrated as having two load sensors 118 mounted thereon for detecting electrical loads of two load conductors 112 from a single branch circuit breaker 110, bracket 124 may have any number of load sensors 118 mounted thereon for detecting electrical loads of any number of load conductors 112 from a single breaker 110, and/or any number of load sensors 118 mounted thereon for detecting electrical loads of any number of load conductors 112 from a plurality of breakers 110. Load sensors 118 may each be positioned on bracket 124 in any suitable orientation, location, fashion, configuration, and/or arrangement. In the exemplary embodiment, two load sensors 118 are mounted on opposite sides of bracket 124 to facilitate nesting sensors 118 for parallel circuits. In some embodiments, two load sensors 118 mounted on bracket 124 are coupled together (whether before, during, or after being coupled to bracket 124) for positioning together with respect to bracket 124. In some embodiments, a diameter of opening 130 is larger than a diameter of a corresponding load conductor 112.

Load sensing assembly 116 may be coupled to panel 100 or panel 200 in any suitable fashion, configuration, arrangement, orientation, location, and/or by any suitable structure and/or means. For example, FIG. 4 is a perspective view of one exemplary embodiment of load sensing assembly 116 coupled to panel 100 (shown in FIG. 1) or panel 200 (shown in FIG. 2). Although a plurality of brackets 124 are illustrated in FIG. 4, panel 100 or panel 200 may have any number of brackets mounted thereon. Load sensing assembly 116 includes a connector 132 coupled to panel 100 or 200. Connector 132 may be coupled to panel 100 or 200 in any suitable fashion, configuration, arrangement, orientation, location, and/or by any suitable structure and/or means. In the exemplary embodiment of FIG. 4, connector 132 is coupled to backplane 104 (shown in FIGS. 1 and 2) adjacent circuit breakers 110. Connector 132 may be coupled to backplane 104 in any suitable fashion, configuration, arrangement, location, orientation, and/or by any suitable structure and/or means. In the exemplary embodiment of FIG. 4, connector 132 is coupled to backplane 104 using threaded fasteners 134.

Bracket 124 is coupled to connector 132 in any suitable fashion, configuration, arrangement, location, orientation, and/or by any suitable structure and/or means. In the exemplary embodiment of FIG. 4, bracket 124 is coupled to connector 132 using threaded fasteners 136. Connector 132 is coupled to backplane 104, and bracket 124 is coupled to connector 132 in such a location, orientation, fashion, configuration, and/or arrangement, and/or by such structure and/or means, that facilitates aligning a load conductor 112 with a load sensor 118, or more specifically in the exemplary embodiment, facilitates aligning a load conductor 112 with a corresponding slot 126 and a corresponding load sensor opening 130. For example, in the exemplary embodiment of FIG. 4, connector 132 is mounted generally below circuit breakers 110 such that bracket 124 and load sensors 118 are generally adjacent load conductors 112. Moreover, connector 132 may have any size and/or shape that facilitates aligning a load conductor 112 with a load sensor 118, or more specifically in the exemplary embodiment, facilitates aligning a load conductor 112 with a corresponding slot 126 and a corresponding load sensor opening 130. For example, in the exemplary embodiment of FIG. 4, connector 132 is a generally L-shaped plate that facilitates positioning bracket 124 and load sensors 118 generally adjacent load conductors 112.

In some embodiments load sensing assembly 116 is modular, such that assembly 116 may facilitate sub-metering a power distribution system as a retrofit to an existing power distribution system or as a new installation. For example, in some embodiments load sensing assembly 116 may be installed into panel 100 and 200 in a factory environment and may be installed into distribution panels 100 and 200 in a field installation environment.

FIG. 5 is a perspective view of another exemplary embodiment of load sensing assembly 116 coupled to panel 100 (shown in FIG. 1) or panel 200 (shown in FIG. 2). Although a plurality of brackets 124 are illustrated, panel 100 or panel 200 may have any number of brackets mounted thereon. Load sensing assembly 116 includes a connector 138 coupled to panel 100 or 200. Connector 138 may be coupled to panel 100 or 200 in any suitable fashion, configuration, arrangement, orientation, location, and/or by any suitable structure and/or means. In the exemplary embodiment of FIG. 5, connector 138 is coupled to backplane 104 (shown in FIGS. 1 and 2) adjacent circuit breakers 110. Connector 138 may be coupled to backplane 104 in any suitable fashion, configuration, arrangement, orientation, location, and/or by any suitable structure and/or means. In the exemplary embodiment of FIG. 5, connector 138 is coupled to backplane 104 in a "plug-in" configuration wherein connector 138 is received within an opening 142 of backplane 104 and retained within opening 142 via stiction, friction, and/or a biasing mechanism (not shown), such as, but not limited to, a spring clip.

Bracket 124 is coupled to connector 138 in any suitable fashion, configuration, arrangement, location, orientation, and/or by any suitable structure and/or means. In the exemplary embodiment of FIG. 5, bracket 124 is coupled to connector 138 using threaded fasteners 140. Connector 138 is coupled to backplane 104, and bracket 124 is coupled to connector 138 in such a location, orientation, fashion, configuration, and/or arrangement, and/or by such structure and/or means, that facilitates aligning a load conductor 112 with a load sensor 118, or more specifically in the exemplary embodiment, facilitates aligning a load conductor 112 with a corresponding slot 126 and a corresponding load sensor opening 130. For example, in the exemplary embodiment of FIG. 5, connector 138 is mounted generally below circuit breakers 110 such that bracket 124 and load sensors 118 are generally adjacent load conductors 112. Moreover, connector 138 may have any size and/or shape that facilitates aligning a load conductor 112 with a load sensor 118, or more specifically in the exemplary embodiment, facilitates aligning a load conductor 112 with a corresponding slot 126 and a corresponding load sensor opening 130. For example, in the exemplary embodiment of FIG. 5, connector 132 has a generally rectangular shape that facilitates positioning bracket 124 and load sensors 118 generally adjacent load conductors 112.

FIG. 6 is a perspective view of sub-metering electronics housing 122. As shown in FIGS. 1 and 2, housing 122 may be coupled to panels 100 or 200. Housing 122 may be coupled to panels 100 or 200 in any suitable fashion, configuration, arrangement, orientation, location, and/or by any suitable structure and/or means. As shown in FIG. 6, in the exemplary embodiment, and for example, housing 122 is coupled directly to backplane 104 (shown in FIGS. 1 and 2) using an exemplary bracket 142. Housing 122 includes a body 144 having an interior cavity 146 and a door 148 coupled to body 144 for movement with respect to body 144 and therefore panels 100 or 200, and more specifically in the exemplary embodiment with respect to backplane 104. Door 148 is movable between a closed position 150 shown in FIG. 6 that facilitates preventing access to interior cavity 146 and facilitates protecting components at least partially contained within interior cavity 146 from damage (for example during maintenance or installation), and an open position 152 that facilitates providing access to interior cavity 146 and therefore components at least partially contained therein. FIG. 7 is a perspective view of housing 122 illustrating door 148 in open position 152. Door 148 may be movable with respect to housing body 144 in any suitable configuration, arrangement, fashion, and by any suitable structure and/or means. In the exemplary embodiment, and for example, door 148 is coupled to housing body 144 for movement with respect thereto using a hinge 154. Door 148 may include a latch 156 of any suitable configuration, arrangement, fashion, structure, and/or means to facilitate retaining door 148 in closed position 150.

As described above, one or more sub-metering electronics systems 120 may be at least partially contained within housing interior cavity 146 and operatively coupled to one or more of load sensors 118 (shown in FIGS. 1-5) for determining the electrical load in one or more of the branch circuits, based on the corresponding detected load. Although only one sub-metering electronics system 120 is illustrated, housing 122 may include any number of sub-metering electronics systems 120 at least partially contained within cavity 146. Moreover, panels 100 and 200 may include any number of sub-metering electronics systems 120, whether contained within the same or different housings 122. Sub-metering electronics system 120 is coupled to door 148 for movement therewith. Although system 120 may be coupled to door 148 in any suitable fashion, configuration, arrangement, orientation, location, and/or by any suitable structure and/or means, in the exemplary embodiment sub-metering electronics system 120 is coupled to an interior surface 158 of door 148. Coupling sub-metering electronics system 120 to door 148 for movement therewith may facilitate easier removal, calibration, and/or maintenance as compared with some known electrical distribution panels.

In the exemplary embodiment, one or more fuse blocks 160 and one or more interface boards 162 are coupled to housing body 144. Interface board 162 is operatively coupled to load sensors 118 for receiving load signals therefrom. One or more electrical disconnects 164 are also coupled to housing body 144 for permitting deenergization of components within housing 122, such as, but not limited to, interface board 162, sub-metering electronics system 120, and/or a meter head 166 of system 120. Fuse blocks 160, interface board 162, and electrical disconnects 164 may be coupled to housing body 144 in any suitable fashion, configuration, arrangement, orientation, location, and/or by any suitable structure and/or means. In the exemplary embodiment, fuse blocks 160, interface board 162, and electrical disconnects 164 are coupled to a back wall 167 of housing body 144. In the exemplary embodiment, door 148 includes an opening 168 sized and shaped to receive at least a portion of sub-metering electronics system 120. For example, in the exemplary embodiment opening 168 is sized and shaped to receive at least a portion of meter head 166 such that meter head 166 are viewable when door 148 is in closed position 150.

In some embodiments, backplane 104 having load sensing assembly 116, branch circuit breakers 110, sub-metering electronics system(s) 120, and/or housing(s) 122 coupled thereto may be delivered to a location of ultimate use as one unit and thereafter attached to an electrical distribution panel base 102. As such, at least some electrical and mechanical interconnections between backplane 104, breakers 110, assembly 116, system 120, and/or housing 122 may be accomplished before delivering to the location of ultimate use, which may facilitate easier installation of backplane 104, load sensing assembly 116, branch circuit breakers 110, sub-metering electronics system(s) 120, and/or housing(s) 122 at the location of ultimate use.

The above-described panels, assemblies, and methods may facilitate sub-metering power distribution in a modular, prefabricated, error-proofed form that may be cost-effective and reliable for monitoring and managing the metering operation of facilities. More specifically, the panels, assemblies, and methods described and/or illustrated herein may facilitate determining system load attributable to each of a plurality of branch circuits. As a result, the panels, assemblies, and methods described and/or illustrated herein may facilitate determining branch owner power costs in a cost-effective and reliable manner.

Exemplary embodiments of panels, assemblies, and methods are described and/or illustrated herein in detail. The panels, assemblies, and methods are not limited to the specific embodiments described herein, but rather, components of each assembly and panel, as well as steps of each method, may be utilized independently and separately from other components and steps described herein. Each component, and each method step, can also be used in combination with other components and/or method steps.

When introducing elements/components/etc. of the panels, assemblies, and methods described and/or illustrated herein, the articles "a", "an" "the" and "said" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc.

While the invention has been described in terms of various specific embodiments, those skilled in the art will recognize that the invention can be practiced with modification within the spirit and scope of the claims.

What is claimed is:

1. An electrical distribution panel comprising:
   an enclosure comprising a plurality of sidewalls and a base, said base comprising an interior surface;
   a backplane coupled to said interior surface;
   a circuit breaker coupled to said backplane, said circuit breaker comprising a load conductor for transmitting electrical power to a load; and
   a load sensing assembly comprising a bracket and load sensor operatively coupled to said load conductor for detecting an electrical load of said load conductor and generating a load signal proportional to the electrical load, said load sensor further coupled to said bracket and selectively positionable with respect to said load conductor at a plurality of fixedly secured positions on said bracket to facilitate positioning said load sensor with respect to said load conductor, wherein said bracket is not integrated with said circuit breaker.

2. An electrical distribution panel in accordance with claim 1 wherein said load sensing assembly is coupled to said backplane such that said load sensor is movable with respect to at least a portion of said load sensing assembly to facilitate positioning said load sensor with respect to said load conductor.

3. An electrical distribution panel in accordance with claim 1 wherein said circuit breaker comprises a plurality of load conductors and said load sensing assembly includes a plurality of load sensors, each of said plurality of load sensors operatively coupled to a corresponding load conductor of said plurality of load conductors for detecting an electrical load of said load conductor and generating a load signal proportional to the electrical load, each of said plurality of load sensors positioned in a nested configuration with respect to an adjacent load sensor of said plurality of load sensors.

4. An electrical distribution panel in accordance with claim 1 comprising a plurality of circuit breakers each having a load conductor, wherein said load sensing assembly includes a plurality of load sensors each operatively coupled to said load conductor of a corresponding circuit breaker of said plurality of circuit breakers for detecting an electrical load of said load conductor and generating a load signal proportional to the electrical load.

5. An electrical distribution panel in accordance with claim 1 wherein said load conductor comprises a phase cable of said circuit breaker.

6. An electrical distribution panel in accordance with claim 5 wherein said load sensor comprises an opening, a portion of said load conductor extends through said opening, and said load sensor is selectively positionable with respect to at least a portion of said load sensing assembly to facilitate aligning said load conductor with said opening.

7. An electrical distribution panel in accordance with claim 1 wherein said load sensor comprises a current transformer.

8. An electrical distribution panel in accordance with claim 1 wherein said load sensing assembly further comprises a connector, said connector is coupled to said backplane, said bracket is coupled to said connector, and said load sensor is coupled to said bracket.

9. An electrical distribution panel in accordance with claim 1 wherein said bracket comprises a slot, and said load sensor is selectively positionable on said bracket at a plurality of fixedly secured positions along said slot to facilitate positioning said load sensor with respect to said load conductor.

10. An electrical distribution panel in accordance with claim 9 wherein said load sensor is coupled to said bracket such that said load sensor is configured to move continuously along said slot with respect to said bracket to facilitate positioning said load sensor with respect to said load conductor.

11. An electrical distribution panel in accordance with claim 9 wherein at least a portion of said slot extends completely through a thickness of said bracket such that said at least a portion of said slot defines a slot opening through said bracket, and a portion of said load conductor extends through said slot opening.

12. An electrical distribution panel in accordance with claim 9 wherein said circuit breaker comprises a plurality of load conductors and said load sensing assembly includes a plurality of load sensors, said bracket comprising two load sensors of said plurality of load sensors coupled thereto, wherein each of said two load sensors is positioned on an opposite side of said bracket.

13. An electrical distribution panel in accordance with claim 1 further comprising a sub-metering electronics system coupled to said backplane and operatively coupled to said load sensor, said sub-metering electronics system configured to determine a branch circuit load using the detected electrical load.

14. An electrical distribution panel in accordance with claim 13 wherein said sub-metering electronics system is at least partially contained within an interior cavity of a housing coupled to said backplane, said housing comprising a door for facilitating access to said interior cavity, at least a portion of said sub-metering electronics system coupled to said door for movement of said door with respect to said backplane.

15. An electrical distribution panel in accordance with claim 14 wherein said sub-metering electronics system comprises a meter head, and said door comprises an opening for receiving at least a portion of said meter head such that said meter head is viewable when said door is in a closed position that facilitates preventing access to said interior cavity.

16. An electrical distribution panel in accordance with claim 14 wherein said door comprises a latch to facilitate retaining said door in a closed position that facilitates preventing access to said interior cavity.

17. A load sensing assembly for use with an electrical distribution panel having a backplane and a circuit breaker coupled to the backplane, the circuit breaker having a load carrying circuit conductor, said load sensing assembly comprising:
a plurality of brackets, each of said plurality of brackets comprising a slot, each of said plurality of brackets coupled to the backplane, each of said plurality of brackets not integrated with the circuit breaker; and
a plurality of load sensors, each of said plurality of load sensors coupled to a corresponding bracket of said plurality of brackets, each of said plurality of load sensors operatively coupled to a respective load carrying circuit conductor of a plurality of load carrying circuit conductors for generating a load signal proportional to the load carried in the respective load carrying circuit conductor, each of said plurality of load sensors positioned in a nested configuration with respect to an adjacent load sensor of said plurality of load sensors.

18. A load sensing assembly in accordance with claim 17 wherein said load sensor is coupled to said bracket such that said load sensor is configured to move with respect to said bracket along said slot to facilitate positioning said load sensor with respect to the load carrying circuit conductor.

19. A load sensing assembly in accordance with claim 17 further comprising a connector coupled to the backplane, said bracket coupled to said connector.

20. A load sensing assembly in accordance with claim 19 wherein said connector comprises an opening and is coupled to said electrical distribution panel using a threaded fastener received through said opening.

21. A load sensing assembly in accordance with claim 19 wherein said connector comprises a generally L-shaped plate.

22. A load sensing assembly in accordance with claim 19 wherein said connector is configured to be received within an opening of the electrical distribution panel and is configured to be retained within the opening via at least one of stiction and a biasing mechanism.

23. A load sensing assembly in accordance with claim 19 wherein said bracket is coupled to said connector using a threaded fastener.

24. A load sensing assembly in accordance with claim 17 wherein at least a portion of said slot extends completely through a thickness of said bracket such that said at least a portion of said slot defines a slot opening through said bracket, and said bracket is configured to be coupled to the electrical distribution panel such that the load carrying circuit conductor at least partially extends through said slot opening.

25. A load sensing assembly in accordance with claim 17 wherein said load sensor comprises an opening configured to at least partially receive the load carrying circuit conductor, and said load sensor is selectively positionable along said slot to facilitate aligning the load carrying circuit conductor with said opening.

26. A load sensing assembly in accordance with claim 17 wherein said load sensor comprises a current transformer.

27. A method of coupling a load sensor to an electrical distribution panel, said method comprising:
coupling the load sensor to a bracket, the bracket including a slot extending at least partially therethrough;
coupling the bracket to a backplane of the electrical distribution panel, the bracket not integrated with a circuit breaker coupled to the backplane and having a load carrying circuit conductor;
moving the load sensor along the slot within the bracket and with respect to the load carrying circuit conductor after coupling the load sensor to the bracket to position the load sensor with respect to the load carrying circuit conductor;

fixedly securing the load sensor with respect to the bracket; and operatively coupling the load sensor to the load carrying circuit conductor.

28. A method in accordance with claim 27 further comprising extending a portion of the load carrying circuit conductor through the slot.

29. A method in accordance with claim 27 wherein operatively coupling the load sensor comprises extending a portion of the load carrying circuit conductor through an opening within the load sensor.

30. A method in accordance with claim 27 further comprising:

coupling a housing for a sub-metering electronic system to the electrical distribution panel; and coupling at least a portion of the sub-metering electronic system to a door of the housing that moves with respect to the electrical distribution panel.

* * * * *